(12) United States Patent
Schmidt et al.

(10) Patent No.: US 10,585,619 B1
(45) Date of Patent: Mar. 10, 2020

(54) MEMORY BLOCK ERASURE

(71) Applicant: International Business Machines Corporation, Armonk, NY (US)

(72) Inventors: Martin B. Schmidt, Stuttgart (DE); Peter Altevogt, Ettlingen (DE); Wolfgang Gellerich, Boeblingen (DE); Juergen Pille, Stuttgart (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/191,652

(22) Filed: Nov. 15, 2018

(51) Int. Cl.
G11C 11/56 (2006.01)
G11C 11/413 (2006.01)
G06F 3/06 (2006.01)
G11C 7/20 (2006.01)

(52) U.S. Cl.
CPC ............ *G06F 3/0652* (2013.01); *G06F 3/064* (2013.01); *G11C 7/20* (2013.01); *G11C 11/413* (2013.01); *G11C 11/5635* (2013.01)

(58) Field of Classification Search
CPC ................................................ G11C 11/5635
USPC ................................................. 365/218, 156
See application file for complete search history.

(56) References Cited

U.S. PATENT DOCUMENTS

| | | | |
|---|---|---|---|
| 7,161,842 B2 * | 1/2007 | Park | G11C 16/16 365/185.23 |
| 7,804,718 B2 * | 9/2010 | Kim | G11C 16/0483 365/185.11 |
| 9,679,632 B2 | 6/2017 | Mohammad et al. | |
| 9,952,802 B2 | 4/2018 | Salah et al. | |
| 2016/0293244 A1 | 10/2016 | Mohammad et al. | |

FOREIGN PATENT DOCUMENTS

| CN | 204045210 U | 12/2014 |
|---|---|---|
| CN | 106844045 A | 6/2017 |

OTHER PUBLICATIONS

Disclosed Anonymously, "How to clear RAM", liutilities.com, Free Resource Libraries, URL: http://www.liutilities.com/how-to/clear-ram/, 2 pages.

* cited by examiner

*Primary Examiner* — Son L Mai
(74) *Attorney, Agent, or Firm* — Cantor Colburn LLP; Margaret McNamara (57) ABSTRACT

Embodiments of memory block erasure are described herein. An aspect includes determining a first word line set consisting of a first plurality of word lines. Another aspect includes activating the first plurality of word lines, such that a respective memory cell that is connected to each of the first plurality of word lines is erased by the activation of the first plurality of word lines. Another aspect includes determining a second word line set, wherein the second word line set consists of the first word line set and a second plurality of word lines. Another aspect includes simultaneously activating the first plurality of word lines and the second plurality of word lines, such that a respective memory cell that is connected to each of the second plurality of word lines is erased by the activation of the first plurality of word lines and the second plurality of word lines.

20 Claims, 6 Drawing Sheets

WL SET 0: WORD LINE 0
401A

WL SET 1: WORD LINES 0 AND 1
401B

WL SET 2: WORD LINES 0, 1, 2 AND 3
401C

WL SET 3: WORD LINES 0, 1, 2, 3, 4, 5, 6, AND 7
401D

WL SET 4: WORD LINES 0, 1, 2, 3, 4, 5, 6, 7, 8, 9, 10, 11, 12, 13, 14, AND 15
401E

WL SET N: WORD LINES 0 TO 2^N-1
401N

FIG. 4

| |
|---|
| WL SET 0: WORD LINE 15<br>501A |
| WL SET 1: WORD LINES 7 AND 15<br>501B |
| WL SET 2: WORD LINES 3, 7, 11, AND 15<br>501C |
| WL SET 3: WORD LINES 1, 3, 5, 7, 9, 11, 13, AND 15<br>501D |
| WL SET 4: WORD LINES 0, 1, 2, 3, 4, 5, 6, 7, 8, 9, 10, 11, 12, 13, 14, AND 15<br>501E |

| |
|---|
| WL SET N: WORD LINES $X*2^{(Q-N)} - 1$,<br>FOR X FROM 1 TO $2^N$<br>501N |

MEMORY BLOCK ERASURE

BACKGROUND

The present techniques relate to computer memory. More specifically, the techniques relate to the erasure of memory blocks in computer memory.

Computer memory may be organized in a hierarchy, from processor registers, over multiple cache levels, to external main memory. The highest or uppermost cache level is the one closest to the processor, and the lowest cache level is the one closest to the main memory. Access latency is lowest, and bandwidth is highest, for registers and upper cache levels. For example, a data word in core static random access memory (SRAM) may be accessed in 1 clock cycle. For the cache, accessing a data word may require two to tens of cycles, and for the main memory, up to hundreds of cycles.

On a memory level, the memory is partitioned into arrays, which make up random access memory (RAM) cores. The RAM cores are designed to have a relatively small physical area. The cores are combined into a memory array. Memory arrays are gathered together into units, and then connected into cache memory by multiplexers. At the array level, data is organized in words, with each word having a respective address. Each bit of each word is stored in a single cell. An SRAM cell may include 6 transistors, including two cross-coupled inverters (including 4 transistors) and two access transistors (or word line transistors). Write data is transmitted to the cells by bit lines. Read data is transmitted from the cell to the read-out circuit using either one of the two bit lines or using both bit lines. The number of cells on a bit line can be as any appropriate number, for example, from 16 to 1024 cells per bit line.

SUMMARY

According to an embodiment described herein, a system can include logic to determine a memory block comprising a plurality of memory cells to be erased. The logic can also, based on determining the memory block, perform an erasure. The logic can also determine a first word line set consisting of a first plurality of word lines, each of the first plurality of word lines being connected to a respective memory cell of the plurality of memory cells. The logic can also activate the first plurality of word lines corresponding to the first word line set, such that a respective memory cell that is connected to each of the first plurality of word lines is erased by the activation of the first plurality of word lines. The logic can also determine a second word line set, wherein the second word line set consists of the first word line set and a second plurality of word lines, each of the second plurality of word lines being connected to a respective memory cell of the plurality of memory cells. The logic can also simultaneously activate the first plurality of word lines and the second plurality of word lines corresponding to the second word line set, such that a respective memory cell that is connected to each of the second plurality of word lines is erased by the activation of the first plurality of word lines and the second plurality of word lines.

According to another embodiment described herein, a method can include determining a memory block comprising a plurality of memory cells to be erased. The method can also include, based on determining the memory block, performing an erasure. The method can also include determining a first word line set consisting of a first plurality of word lines, each of the first plurality of word lines being connected to a respective memory cell of the plurality of memory cells. The method can also include activating the first plurality of word lines corresponding to the first word line set, such that a respective memory cell that is connected to each of the first plurality of word lines is erased by the activation of the first plurality of word lines. The method can also include determining a second word line set, wherein the second word line set consists of the first word line set and a second plurality of word lines, each of the second plurality of word lines being connected to a respective memory cell of the plurality of memory cells. The method can also include simultaneously activating the first plurality of word lines and the second plurality of word lines corresponding to the second word line set, such that a respective memory cell that is connected to each of the second plurality of word lines is erased by the activation of the first plurality of word lines and the second plurality of word lines.

According to another embodiment described herein, an apparatus can be configured to determine a memory block comprising a plurality of memory cells to be erased. The apparatus can also be configured to, based on determining the memory block, perform an erasure. The apparatus can also be configured to determine a first word line set consisting of a first plurality of word lines, each of the first plurality of word lines being connected to a respective memory cell of the plurality of memory cells. The apparatus can also be configured to activate the first plurality of word lines corresponding to the first word line set, such that a respective memory cell that is connected to each of the first plurality of word lines is erased by the activation of the first plurality of word lines. The apparatus can also be configured to determine a second word line set, wherein the second word line set consists of the first word line set and a second plurality of word lines, each of the second plurality of word lines being connected to a respective memory cell of the plurality of memory cells. The apparatus can also be configured to simultaneously activate the first plurality of word lines and the second plurality of word lines corresponding to the second word line set, such that a respective memory cell that is connected to each of the second plurality of word lines is erased by the activation of the first plurality of word lines and the second plurality of word lines.

DETAILED DESCRIPTION

Embodiments of memory block erasure are provided, with exemplary embodiments being discussed below in detail. Memory block erasure, e.g., clearing of relatively large blocks of memory so that each cell in the block of memory holds the same value (e.g., all cells hold '0', or all cells hold '1') after the erasure is completed, may be performed relatively frequently in a computer system, and may affect overall system performance. Memory block erasure may be performed on a cache line by cache line basis. However, for such an erasure, the complexity increases linearly with the number of cache lines to be cleared because the address bits may activate a single word line at a time, requiring many processor cycles to perform the erasure.

Memory cells may show a relatively large hysteresis due to contention during changing of that state of a memory cell. When a cell with content '1' is cleared (e.g., flipped to hold a content of '0'), the transistors in the cell may fight against the clearing. A higher electrical current being provided by the data-in drivers to the cell may reduce the time required to clear the cell, so that less total energy will be necessary to clear or write the cell. In order to reduce hysteresis, a divide and conquer approach may be used over multiple iterations to erase a memory block. Initially, one or only a few cells on the bit line are erased. These cleared cells are activated in the next clearing step, and will help to erase other adjacent cells by increasing the driver strength of the data-in driver. In each subsequent iteration, there are more cells that have been erased, and the erased cells are activated along with the cells that are currently being cleared in order to reduce hysteresis. In some embodiments, in each iteration, the number of activated cells may double, e.g., follow a binary power series. In some embodiments, after a single initial word line is cleared in a first iteration, multiple word lines are activated simultaneously during each subsequent iteration of the erasure. All of the cells in the memory block that is being erased will hold the same value after an erasure is completed. In some embodiments, all of the cells in the memory block may hold a value of '0' after the erasure; in other embodiments, all of the cells in the memory block may hold a value of '1' after the erasure.

The cells that are selected for erasure may be distributed on the bit line in some embodiments, so that cells that have not yet been erased may have a relatively large distance to each other along the bit line, and are located near erased cells. The resistance between the cells may be effectively reduced by distributing the activated cells along the bit line in some embodiments.

Figure 1:
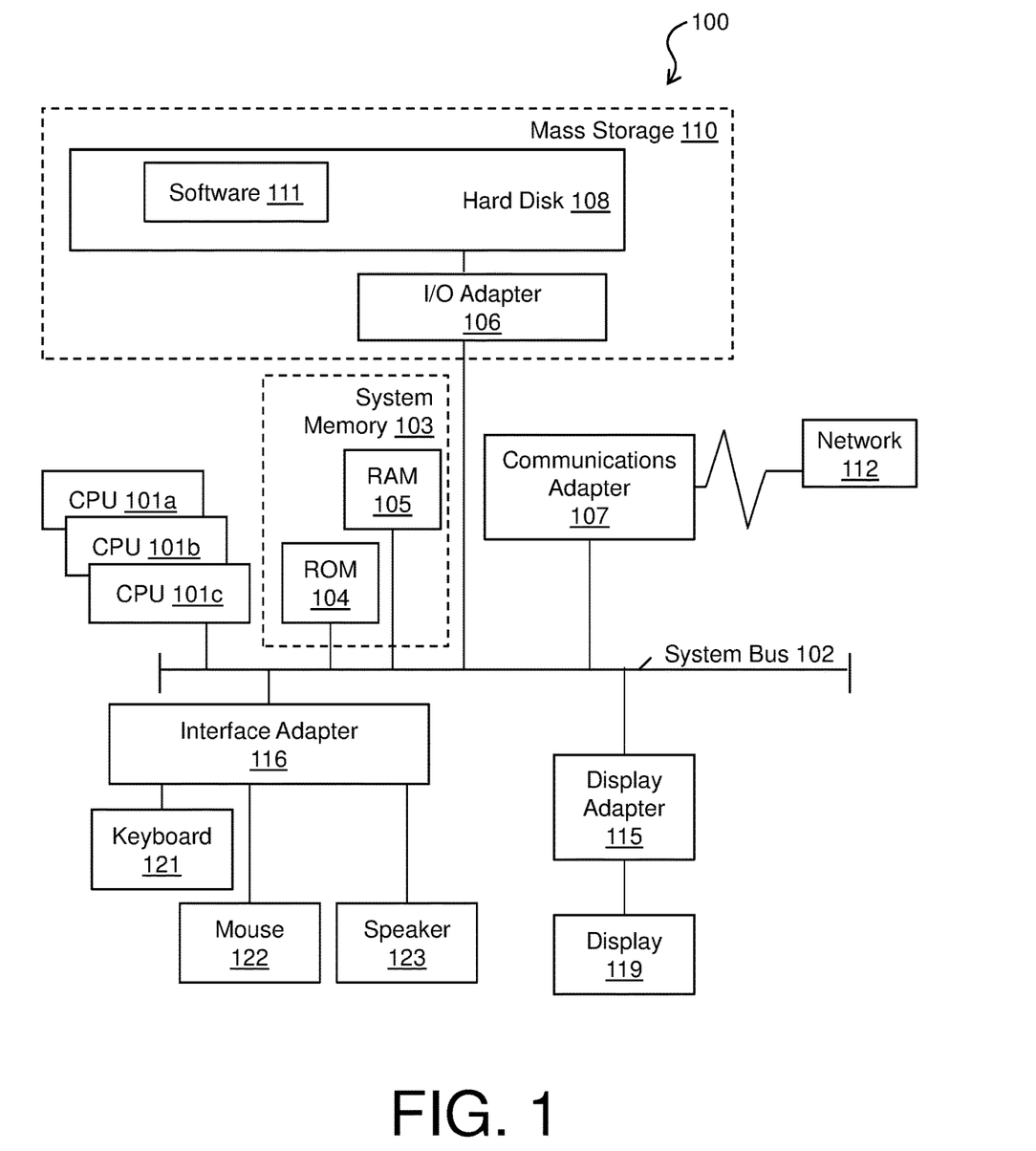
FIG. 1 is a block diagram of an example computer system that may implement memory block erasure.

Turning now to FIG. 1, a computer system 100 is generally shown in accordance with an embodiment. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc. (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system, such as the z/OS or AIX operating system from IBM Corporation, to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by a display adapter 115, which may include a graphics controller to improve the performance of graphics intensive applications and a video controller. A keyboard 121, a mouse 122, a speaker 123, etc. can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computing system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
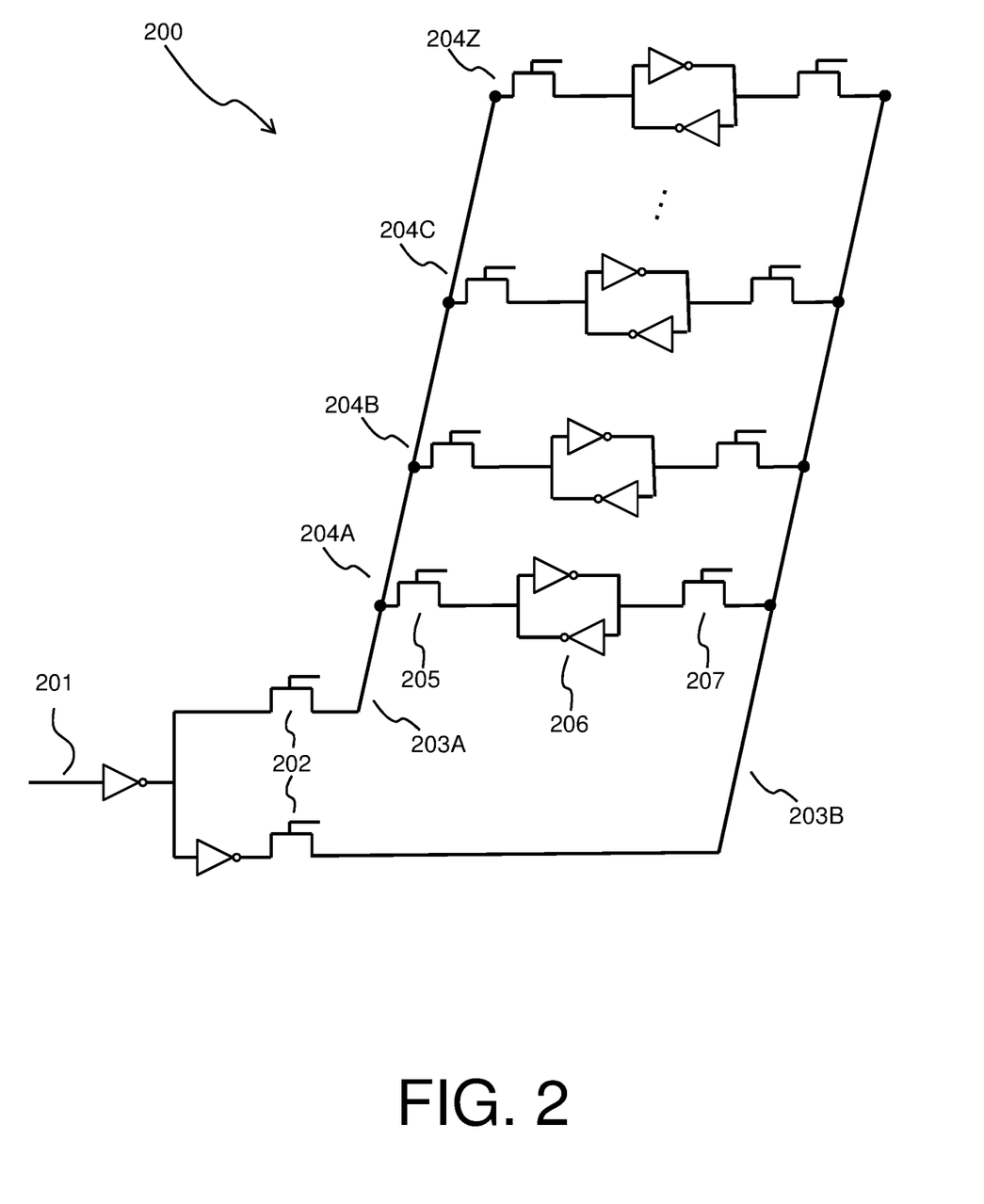
FIG. 2 is a block diagram of an example static random access memory (SRAM) that may implement memory block erasure.

FIG. 2 is a block diagram of example bit line 200 of static random access memory (SRAM) that may implement memory block erasure. The bit line 200 of FIG. 2 may comprise, for example, any of the memory in a computer system such as computer system 100, such as RAM 105, and/or cache memory in CPUs 101a-c. A computer memory may be made up of a plurality of bit lines such as bit line 200. A data input 201 is provided to write transistors 202. Write transistors control write access to all of the cells 204A-Z in the bit line 200. When the gates of the write transistors 202 are activated, the value on the data input 201 is transmitted to the complementary bit line 203A and the true bit line 203B. The bit line 200 as shown includes a plurality of cells 204A-Z; a bit line 200 such as is shown in FIG. 2 may include any appropriate number of cells in various embodiments. Each of the cells 204A-Z is connected across the complementary bit line 203A and the true bit line 203B. As shown in FIG. 2, a cell 204A includes two word line transistors 205 and 207, and cross-coupled inverter 206, which may hold a value of '0' or '1'. Each of the data cells 204A-Z includes respective word line transistors and a cross-coupled inverter. The word line transistors 205 and 207 are used to activate the individual cells in the bit line for reads and writes; each cell 204 A-Z has a respective word line that is addressed by a word line decoder that is connected to the bit line 200.

During a read operation, one or both of the word line transistors 205 and 207 may be activated, or opened, to connect a cell such as cell 204A to bit line 203A and/or 203B. The data stored in cross-coupled inverter 206 will pull the connected bit line to the positive or negative supply rail voltage depending on the content (i.e., '0' or '1') that is stored in the cross-coupled inverter 206. During a write operation in a cell such as cell 204A, both word line transistors 205 and 207 are activated. The cell pulls the connected bit lines 203A-B to the positive or to the negative supply rail voltage. The array write transistors 202 connect the bit lines 203A-B with the data input 201. If the write data on data input 201 is of opposite polarity to the data held in the cross-coupled inverter 206 of the cell 204A, a short circuit current may flow across the cell 204A for a relatively short amount of time in order to flip the contents of the cell. This short-circuit condition is called contention. To reduce contention, in some embodiments, the data input driver voltage is made large enough to overwrite the cell voltage quickly. Reduced contention may lead to power savings, enable a shorter cycle time, and reduce aging effects on the transistors and the surrounding metal layers in the memory that includes bit line 200.

It is to be understood that the block diagram of FIG. 2 is not intended to indicate that the bit line 200 is to include all of the components shown in FIG. 2. Rather, the bit line 200 can include any appropriate fewer or additional components not illustrated in FIG. 2 (e.g., additional transistors, inverters, lines, cells, counters, a driver tree, a word decoder, etc.). Further, the embodiments described herein with respect to bit line 200 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 3:
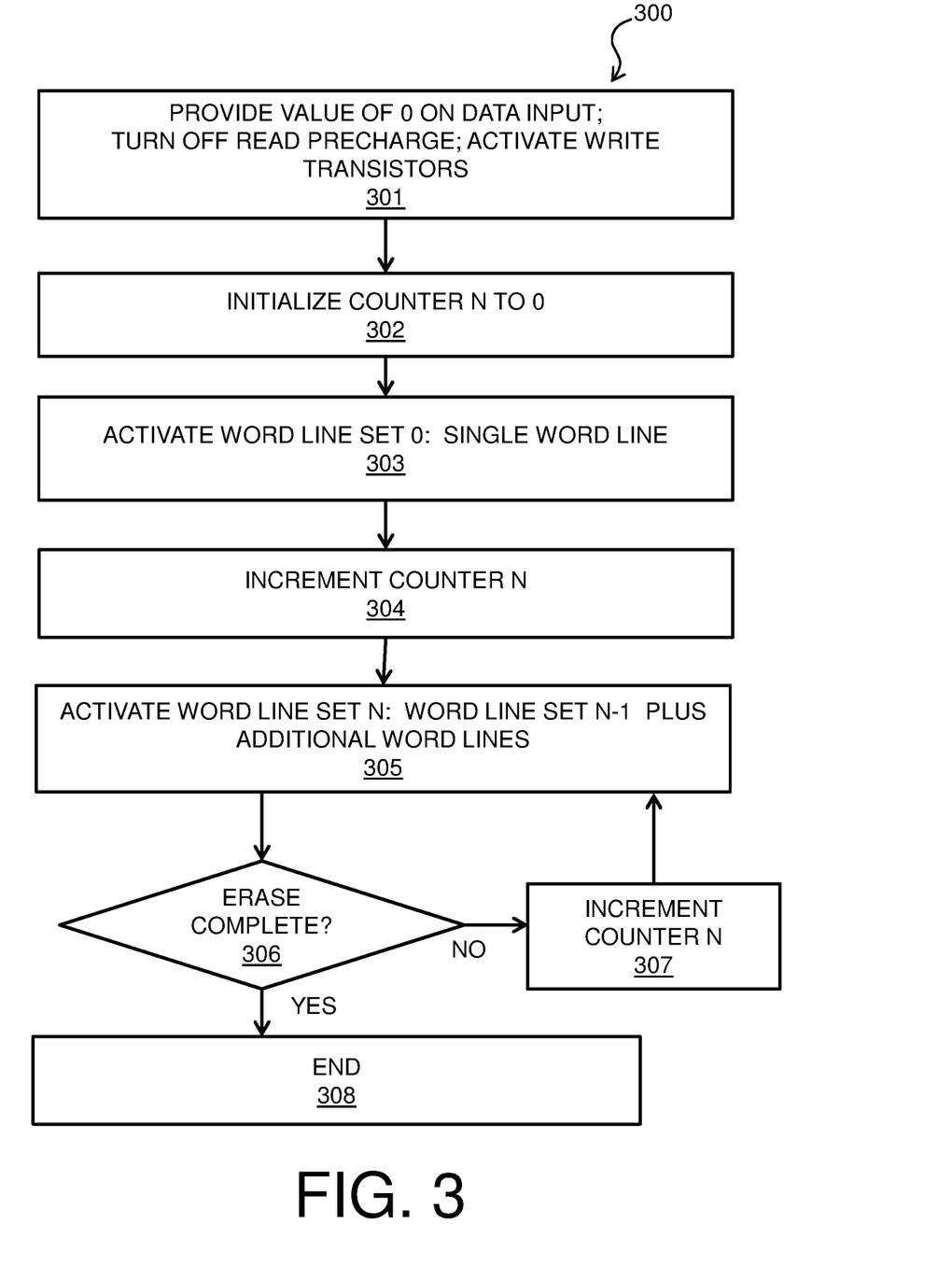
FIG. 3 is a process flow diagram of an example method for memory block erasure.

FIG. 3 is a process flow diagram of an example method for memory block erasure. The method 300 can be implemented within any suitable computing device, such as the computer system 100 of FIG. 1, and is discussed with respect to FIG. 2. In block 301, a bit line 200 of memory that is part of a block of memory to be erased is identified. The block of memory that is being erased may include multiple bit lines; method 300 may be implemented across one or more bit lines in various embodiments. In various embodiments, a subset of the cells in the identified bit line 200 may be erased; in other embodiments, all of the cells in the identified bit line 200 may be erased. In the identified bit line 200, a value of 0 is provided on the data input 201, the write transistors 202 are activated, and the read precharge is turned off. Next, in block 302, a counter N is initialized to 0. The counter N may be any appropriate implementation of a counter. In block 303, word line set 0 is activated based on the value of counter N and the identified cells that are being erased. Word line set 0 may be a single word line corresponding to a single cell in some embodiments and may be word line 0 in some embodiments. In other embodiments, the single word line in word line set 0 is selected to be in the middle of the bit line (e.g., word line 511 for a bit line having 1024 cells), or may be the last cell in the bit line (e.g., word line 1023 for a bit line having 1024 cells) in further embodiments. In further embodiments in which a subset of the cells on the bit line 200 are being erased, word line set 0 may include the first cell in the subset of cells, a cell that is located in the middle of the subset of cells, or the last cell in the subset of cells. When the word line for the cell corresponding to word line set 0 is activated, the erasure data value on the data input 201 is written into the cross-coupled inverter 206 in the activated cell. In some embodiments, the erasure data value may be '0', such that all erased cells in the memory block will hold a value of '0'; in other embodiments, the erasure data value may be '1', such that all erased cells in the memory block will hold a value of '1'. Counter N is then incremented in block 304. Next, in block 305, word line set 1, based on the value of counter N is activated. Word line set 1 includes word line set 0, plus one or more additional word lines. The word lines in word line set 1 are activated simultaneously; the word line from word line set 0 may remain on during the entire erase procedure. The word lines in word line set 1 may be word lines 0 and 1 in some embodiments. In other embodiments, the word lines in word line set 1 may be distributed across the bit line, e.g., selected such that they two word lines in word line set 1 have a maximum distance from one another. For example, word line set 1 may include word lines 511 and 1023 for an erasure of all the cells on a bit line having 1024 cells.

Flow then proceeds to block 306, in which it is determined whether the block erase is complete. For example, if $2^N$ is equal to the number of word lines in the block that is being erased, the block erase may be determined to be complete in block 306. If it is determined in block 306 that the block erase is not complete, flow proceeds to block 307, in which counter N is incremented. From block 307, flow returns to block 305, in which word line set N is activated. Word line set N includes all of the word lines that were included in word line set N−1, plus additional word lines. The word lines in word line set N−1 may stay activated through subsequent iterations of blocks 305-307. The word lines in word line set N are activated simultaneously. In some embodiments, the additional word lines in word line set N may include word lines $2^{N-1}$ to $2^N$. In other embodiments, the additional word lines in word line set N may be distributed across the bit line, e.g., selected such that the opened word lines have a maximum distance from one another. For example, the word lines in word line set N may be given by $X*2^{(Q-N)}-1$, for all integer values of X from 1 to $2^N$, where the number of cells on a bit line that are erased in the whole erasure sequence is $2^Q$. Blocks 305, 306, and 307 are repeated until it is determined in block 306 that the block erase is complete. When it is determined in block 306 that the block erase is complete, flow proceeds to from block 306 to block 308, and method 300 ends. All of the cells on the bit line 200 that are part of the designated memory block may hold a value of 0 at the end of method 300 in some embodiments. In other embodiments, all of the cells on the bit line 200 that are part of the designated memory block may hold a value of 1 at the end of method 300.

The process flow diagram of FIG. 3 is not intended to indicate that the operations of the method 300 are to be executed in any particular order, or that all of the operations of the method 300 are to be included in every case. Additionally, the method 300 can include any suitable number of additional operations.

Figure 4:
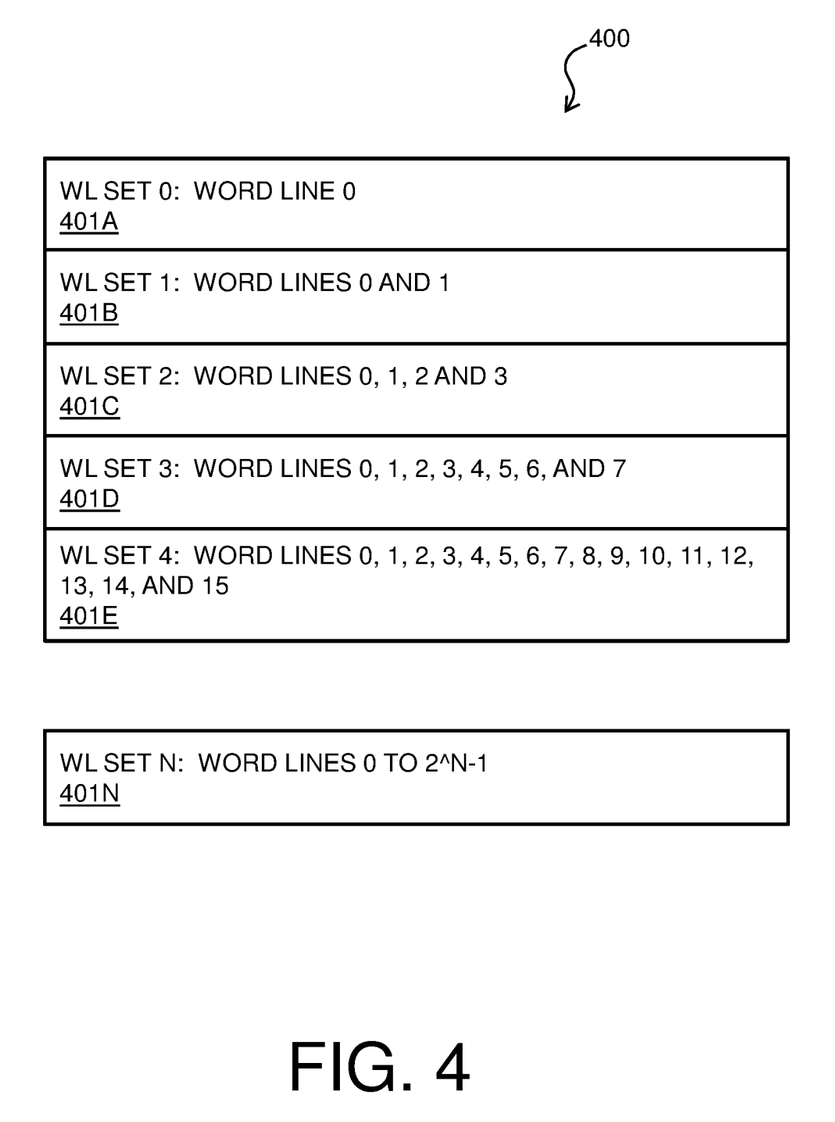
FIG. 4 is an example chart illustrating an embodiment of memory block erasure.

FIG. 4 is an example chart 400 illustrating an embodiment of memory block erasure. The chart illustrates an embodiment of method 300 of FIG. 3, and lists the specific word lines that are included in each word line set for an example memory block erasure of 16 cells (e.g., word lines 0 to 15) that are located on a single bit line. In the example of FIG. 4, the number of additional word lines in each word line set are selected according to a binary power series, and are not distributed on the bit line. In this example, the number of word lines to be erased is 16; however, this is for illustrative purposes only. Any appropriate number of cells on a bit line may be erased according to the embodiment illustrated by FIG. 4. Block 401A shows that word line set 0, which is activated in block 303 of FIG. 3, consists of word line 0. The word lines that have been activated may stay activated as method 300 progresses, and additional word lines are activated in each iteration of block 305, 306, and 307 corresponding to each word line set as the counter N is incremented. As shown in block 401B, word line set 1 consists of word lines 0 and 1. Block 401C shows word line set 2 consisting of 4 word lines (0, 1, 2 and 3). Block 401D shows word line set 3 consisting of 8 word lines (0, 1, 2, 3, 4, 5, 6, and 7). Block 401E shows word line set 4 consisting of 16 word lines (0, 1, 2, 3, 4, 5, 6, 7, 8, 9, 10, 11, 12, 13, 14, and 15). When $2^N$ is equal to the number of cells to be erased (in this example, when N=4), the erase is complete for the particular bit line.

For an erasure of a larger number of cells according to the example of FIG. 4, the counter N may continue to be incremented, and additional word lines added to word line set N and activated, until the all of the designated cells are erased. For a word line set N, as shown in block 401N, word lines 0 to $2^N-1$ are included. When $2^N$ is equal to the number of lines on the bit line that are being erased as part of the designated memory block, the erase is complete for the particular bit line.

Figure 5:
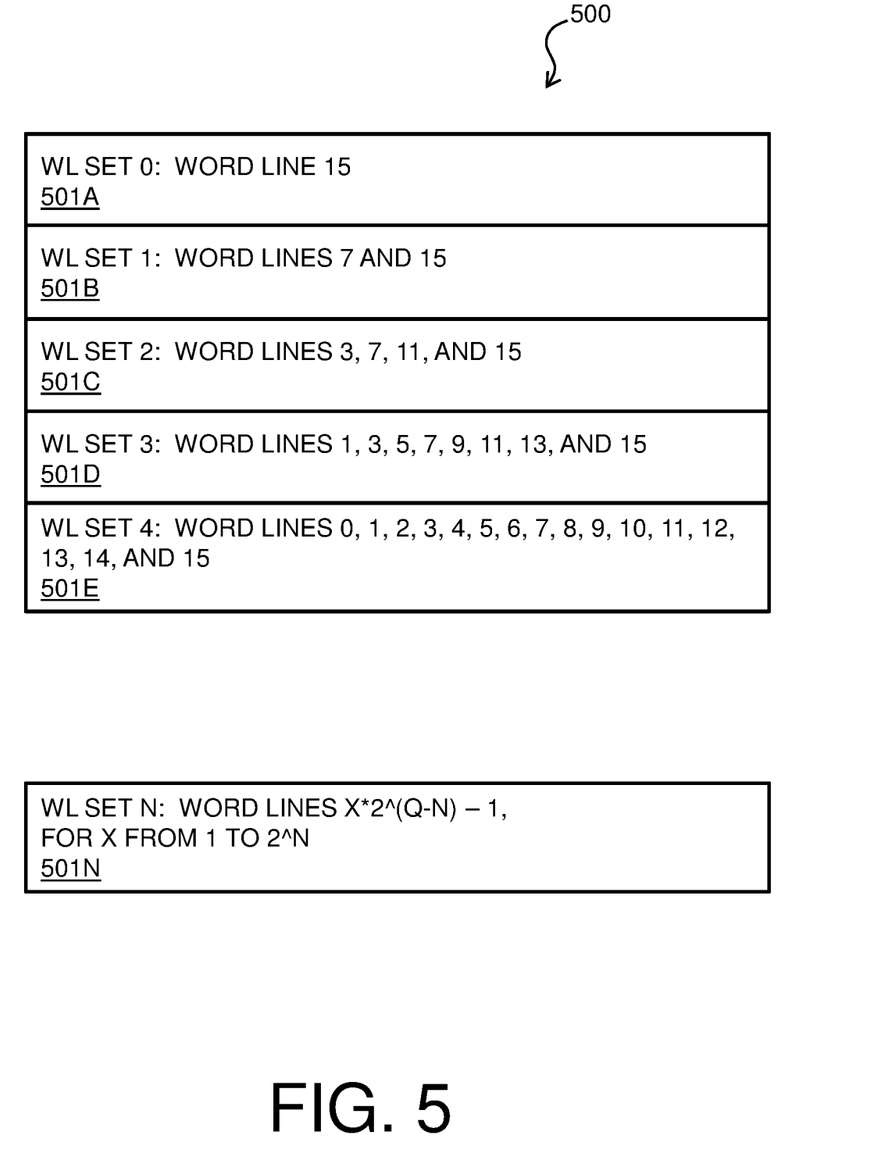
FIG. 5 is an example chart illustrating an embodiment of memory block erasure.

FIG. 5 is an example chart 500 illustrating another embodiment of memory block erasure. The chart illustrates an embodiment of method 300 of FIG. 3, and lists the specific word lines that are included in each word line set for an example memory block erasure of 16 cells (e.g., word lines 0 to 15) on a single bit line. In the example of FIG. 5, the number of additional word lines in each word line set are selected according to a binary power series, and are distributed on the bit line. In this example, the number of cells to be erased is 16; however, this is for illustrative purposes only. Any appropriate number of cells on a bit line may be erased according to the embodiment illustrated by FIG. 5. Block 501A shows that word line set 0, which is activated in block 303 of FIG. 3, consists of word line 15, which is selected due to being the last cell in the set of 16 cells that are being erased. The word lines that have been activated stay activated as method 300 progresses, and additional word lines are activated in each iteration of block 305, 306, and 307 corresponding to each word line set as the counter N is incremented. As shown in block 501B, word line set 1 consists of word lines 7 and 15; word line 7 is selected as being located in halfway between the erased word line 15 and the bit line drivers. Block 501C shows word line set 2 consisting of 4 word lines (3, 7, 11, and 15). Block 501D shows word line set 3 consisting of 8 word lines (1, 3, 5, 7, 9, 11, 13, and 15). Block 501E shows word line set 4 consisting of 16 word lines (0, 1, 2, 3, 4, 5, 6, 7, 8, 9, 10, 11, 12, 13, 14, and 15). When $2^N$ is equal to the number of cells to be erased (in this example, when N=4), the erase is complete for the particular bit line.

For an erasure of a larger number of cells on a single bit line according to the example of FIG. 5, the initial word line set 0 may be selected to be at the end of the cells that are being erased, and additional word lines may be added to subsequent word line sets based on their distance from the already-erased word lines. For example, for a bit line that includes 1024 cells that are all being erased, word line set 0 may be word line 1023 in some embodiments. As counter N is incremented, a word line set N, as shown in block 501N, may include word lines $X*2^{(Q-N)}-1$, for all integer values of X from 1 to $2^N$, wherein $2^Q$ is the number of cells on the bit line that is being erased. When N is equal to Q, the erase is complete.

In some embodiments, the cells on a bit line may have a relatively large mismatch due to inconsistencies in the manufacturing process. Therefore, for a relatively large value of N with many word lines being activated simultaneously, the mismatch may be badly distributed, e.g., the cells having a content of '0' may be weaker cells and the cells having a content of '1' may be stronger cells. In such embodiments, the number of additional word lines in each subsequent word line set may be lower than the value given by the binary power series (as discussed above with respect to FIGS. 4 and 5). In some embodiments, the number of additional word lines may be constant for a number of subsequent word line sets, based on a detected amount of mismatch along the bit line. The number of additional word lines in each word line set may be any appropriate number (e.g., 4), and may vary across word line sets, in various embodiments.

Figure 6:
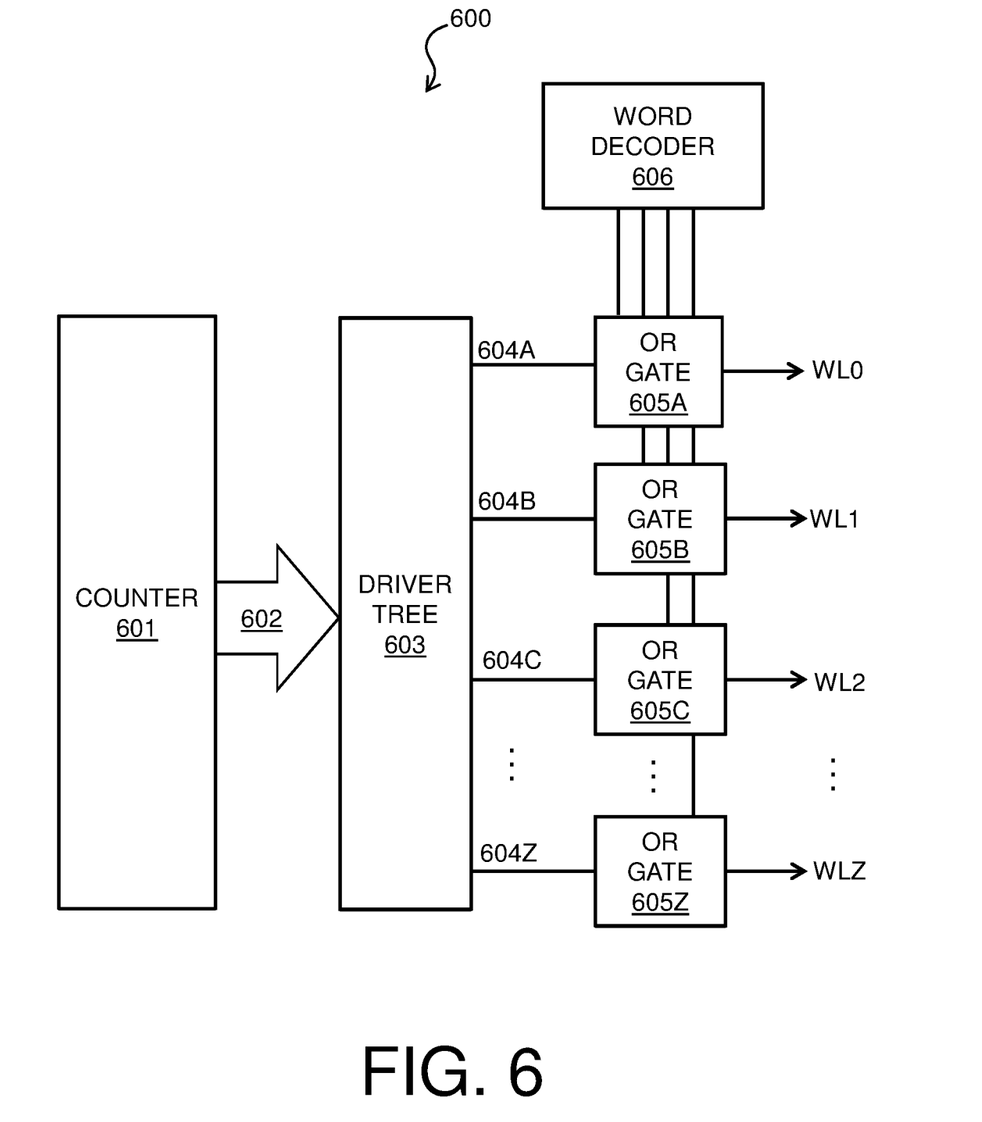
FIG. 6 is a block diagram of an example system for memory block erasure.

FIG. 6 is a block diagram of an example system 600 for memory block erasure. System 600 may implement method 300 of FIG. 3, and may be included in any appropriate memory, such as RAM 105 and/or cache memory in CPUs 101a-c, of FIG. 1, and may be implemented in conjunction with one or more bit lines 200 as shown in FIG. 2. System 600 includes a counter 601 that outputs a counter signal 602. In some embodiments, the counter 601 may be a finite state machine comprising a thermometer counter. In such an embodiment, the counter signal 602 from counter 601 may be a a plurality of outputs a0 to aN, and the counter 601 may, when initialized, output 1 on output a0, and output 0 on outputs a1 to aN. Each time the counter 601 is incremented, an additional output of outputs a0 to aN is given a value of 1, starting at output a1 and proceeding in order to output aN. Therefore, when the counter value N is equal to 1, outputs a0 and a1 have a value of 1, and all other outputs have a value of 0. In such an embodiment, the counter outputs 602 a0 to aN of the counter 601 are provided to a driver tree 603. The thermometer implementation of counter 601 is discussed for illustrative purposes only; any appropriate counter implementation may be used in conjunction with various embodiments of system 600 for memory block erasure.

The driver tree 603 determines word line sets to activate for the memory block erasure based on the counter signal 602 from counter 601, and distributes erase signals on erase signal outputs 604A-Z to the word lines in the current word line set via a plurality of OR gates 605A-Z. In various embodiments, the driver tree 603 may determine the word line sets for which the erase signals are activated in any appropriate manner, such as described above with respect to FIGS. 3, 4, and 5. Each of the OR gates 605A-Z is associated with a single respective word line WL0 to WLZ, and each word line addresses a respective cell, such as cells 204A-Z of FIG. 2. Each of the OR gates 605A-Z receives an input from word decoder 606, which addresses cells in the memory for reads and writes during normal operation of the memory, and an input from a respective erase signal of erase signal outputs 604A-Z from the driver tree 603. Each OR gate 605A-Z activates the OR gate's respective word line via the OR gate's word line output WL1-WLZ based on the state of the two inputs. As the counter 601 is incremented from 0 to Nmax, where $2^{Nmax}$ is the number of cells being erased in the block erase, the word line set that is determined by driver tree 603 grows until all of the cells in the memory block that is being erased (which may be some or all of the cells 204A-Z) have received an erase signal on an erase signal output 604A-Z from driver tree 603. When no block erase is being performed, the erase signal outputs 604A-Z from the driver tree 603 are zero, and the word decoder 606 operates to select the connected cells for reads and writes via the OR gates 605A-Z. The driver tree 603 may also determine, based on the value of the counter 601, whether the memory block erasure is complete, e.g., when $2^N$, where N is the current value of the counter 601, is equal to the number of cells being erased.

It is to be understood that the block diagram of FIG. 6 is not intended to indicate that the system 600 is to include all of the components shown in FIG. 6. Rather, the system 600 can include any appropriate fewer or additional components not illustrated in FIG. 6 (e.g., logic gates, lines, etc.). Further, the embodiments described herein with respect to system 600 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

The present techniques may be a system, a method or an apparatus. The flowchart and block diagrams in the Figures illustrate the architecture, functionality, and operation of possible implementations of systems, methods, and apparatus according to various embodiments of the present techniques. In this regard, each block in the flowchart or block diagrams may represent a module, segment, or portion of logic for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising logic to:
    determine a memory block comprising a plurality of memory cells to be erased; and
    based on determining the memory block, perform an erasure comprising:
        determining a first word line set consisting of a first plurality of word lines, each of the first plurality of word lines being connected to a respective memory cell of the plurality of memory cells;
        activating the first plurality of word lines corresponding to the first word line set, such that a respective memory cell that is connected to each of the first plurality of word lines is erased by the activation of the first plurality of word lines;
        determining a second word line set, wherein the second word line set consists of the first word line set and a second plurality of word lines, each of the second plurality of word lines being connected to a respective memory cell of the plurality of memory cells; and
        simultaneously activating the first plurality of word lines and the second plurality of word lines corresponding to the second word line set, such that a respective memory cell that is connected to each of the second plurality of word lines is erased by the activation of the first plurality of word lines and the second plurality of word lines.

2. The system of claim 1, wherein the logic is to:
determine an initial word line set, the initial word line set consisting of a single word line; and
activate the single word line corresponding to the initial word line set, such that a first memory cell that is connected to the single word line is erased by the activation of the single word line; and
wherein the first plurality of word lines consists of the single word line and one additional word line.

3. The system of claim 2, wherein the one additional word line corresponds to a second memory cell having a maximum distance from the first memory cell along a bit line that includes the first memory cell and the second memory cell.

4. The system of claim 3, wherein the second plurality of word lines is selected such that the first plurality of word lines and the second plurality of word lines are evenly distributed along the bit line.

5. The system of claim 1, wherein a number of the second plurality of word lines is equal to a number of the first plurality of word lines, and wherein the second plurality of word lines is distinct from the first plurality of word lines.

6. The system of claim 1, wherein the logic is to:
initialize a value N of a counter based on the determining the plurality of memory cells to be erased;
increment the value N of the counter based on activating a word line set;
determine a subsequent word line set based on a value of the counter, wherein a number of word lines in the subsequent word line set is equal to $2^N$; and
based $2^N$ being equal to a number of the plurality of memory cells, determine that the erasure is complete.

7. The system of claim 6, wherein the logic is to:
provide the value N of the counter to a driver tree that determines the subsequent word line set, wherein the driver tree provides erase signals to memory cells corresponding to the subsequent word line set via inputs of a plurality of OR gates, each of the plurality of OR gates having an output that is connected to a respective memory cell, and wherein each of the plurality of OR gates receives an input from a word decoder.

8. The system of claim 6, wherein each of the plurality of memory cells holds a value of '1' after the erasure is complete.

9. A computer-implemented method, comprising:
determining a memory block comprising a plurality of memory cells to be erased; and
based on determining the memory block, performing an erasure comprising:
determining a first word line set consisting of a first plurality of word lines, each of the first plurality of word lines being connected to a respective memory cell of the plurality of memory cells;
activating the first plurality of word lines corresponding to the first word line set, such that a respective memory cell that is connected to each of the first plurality of word lines is erased by the activation of the first plurality of word lines;
determining a second word line set, wherein the second word line set consists of the first word line set and a second plurality of word lines, each of the second plurality of word lines being connected to a respective memory cell of the plurality of memory cells; and
simultaneously activating the first plurality of word lines and the second plurality of word lines corresponding to the second word line set, such that a respective memory cell that is connected to each of the second plurality of word lines is erased by the activation of the first plurality of word lines and the second plurality of word lines.

10. The computer-implemented method of claim 9, comprising:
determining an initial word line set, the initial word line set consisting of a single word line; and
activating the single word line corresponding to the initial word line set, such that a first memory cell that is connected to the single word line is erased by the activation of the single word line; and
wherein the first plurality of word lines consists of the single word line and one additional word line.

11. The computer-implemented method of claim 10, wherein the one additional word line corresponds to a second memory cell having a maximum distance from the first memory cell along a bit line that includes the first memory cell and the second memory cell.

12. The computer-implemented method of claim 11, wherein the second plurality of word lines is selected such that the first plurality of word lines and the second plurality of word lines are evenly distributed along the bit line.

13. The computer-implemented method of claim 9, wherein a number of the second plurality of word lines is equal to a number of the first plurality of word lines, and wherein the second plurality of word lines is distinct from the first plurality of word lines.

14. The computer-implemented method of claim 9, comprising:
initializing a value N of a counter based on the determining the plurality of memory cells to be erased;
incrementing the value N of the counter based on activating a word line set;
determining a subsequent word line set based on a value of the counter, wherein a number of word lines in the subsequent word line set is equal to $2^N$; and
based $2^N$ being equal to a number of the plurality of memory cells, determining that the erasure is complete.

15. An apparatus configured to:
determine a memory block comprising a plurality of memory cells to be erased; and
based on determining the memory block, perform an erasure comprising:
determining a first word line set consisting of a first plurality of word lines, each of the first plurality of word lines being connected to a respective memory cell of the plurality of memory cells;
activating the first plurality of word lines corresponding to the first word line set, such that a respective memory cell that is connected to each of the first plurality of word lines is erased by the activation of the first plurality of word lines;
determining a second word line set, wherein the second word line set consists of the first word line set and a second plurality of word lines, each of the second plurality of word lines being connected to a respective memory cell of the plurality of memory cells; and
simultaneously activating the first plurality of word lines and the second plurality of word lines corresponding to the second word line set, such that a respective memory cell that is connected to each of the second plurality of word lines is erased by the activation of the first plurality of word lines and the second plurality of word lines.

16. The apparatus of claim 15, configured to:
- determine an initial word line set, the initial word line set consisting of a single word line; and
- activate the single word line corresponding to the initial word line set, such that a first memory cell that is connected to the single word line is erased by the activation of the single word line; and
- wherein the first plurality of word lines consists of the single word line and one additional word line.

17. The apparatus of claim 16, wherein the one additional word line corresponds to a second memory cell having a maximum distance from the first memory cell along a bit line that includes the first memory cell and the second memory cell.

18. The apparatus of claim 17, wherein the second plurality of word lines is selected such that the first plurality of word lines and the second plurality of word lines are evenly distributed along the bit line.

19. The apparatus of claim 15, wherein a number of the second plurality of word lines is equal to a number of the first plurality of word lines, and wherein the second plurality of word lines is distinct from the first plurality of word lines.

20. The apparatus of claim 15, configured to:
- initialize a value N of a counter based on the determining the plurality of memory cells to be erased;
- increment the value N of the counter based on activating a word line set;
- determine a subsequent word line set based on a value of the counter, wherein a number of word lines in the subsequent word line set is equal to $2^N$; and
- based $2^N$ being equal to a number of the plurality of memory cells, determine that the erasure is complete.

* * * * *